(12) United States Patent
Jocham

(10) Patent No.: US 6,469,896 B2
(45) Date of Patent: Oct. 22, 2002

(54) HOUSING FOR AN ELECTRICAL DEVICE

(75) Inventor: Reinhold Jocham, Hechingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/730,339

(22) Filed: Dec. 5, 2000

(65) Prior Publication Data

US 2001/0003503 A1 Jun. 14, 2001

(30) Foreign Application Priority Data

Dec. 8, 1999 (DE) ......................................... 199 59 023

(51) Int. Cl.[7] ................................................. H05K 7/20
(52) U.S. Cl. ....................... 361/704; 361/707; 361/709; 361/713; 361/719; 165/80.3; 165/185; 174/16.3; 174/52.1
(58) Field of Search ................................ 361/679–685, 361/686, 687, 688, 704, 707, 721, 724, 730, 735, 800, 818; 174/16.3, 17 R, 17.05, 17 CT, 50.59, 53, 54, 58

(56) References Cited

U.S. PATENT DOCUMENTS

| 2,903,626 | A | | 9/1959 | Nye | |
|---|---|---|---|---|---|
| 5,045,971 | A | * | 9/1991 | Ono et al. ................... | 361/704 |
| 5,057,971 | A | * | 10/1991 | Hautvast et al. ............ | 361/740 |
| 5,734,561 | A | * | 3/1998 | Wolf et al. .................. | 361/800 |
| 5,781,415 | A | * | 7/1998 | Itoh ........................... | 361/790 |
| 5,930,114 | A | * | 7/1999 | Kuzmin et al. .............. | 361/704 |
| 5,978,225 | A | * | 11/1999 | Kamphuis ................... | 361/707 |
| 5,978,226 | A | | 11/1999 | Wutz | |
| 6,025,991 | A | * | 2/2000 | Saito .......................... | 361/704 |
| 6,065,530 | A | * | 5/2000 | Austin et al. ............... | 165/80.3 |
| 6,099,325 | A | * | 8/2000 | Parkhill ...................... | 439/76.1 |

FOREIGN PATENT DOCUMENTS

| DE | 38 37 974 A1 | 5/1990 |
|---|---|---|
| DE | 42 15 041 A1 | 11/1992 |
| DE | 41 42 138 C1 | 5/1993 |
| DE | 43 43 355 A1 | 6/1995 |
| DE | 199 12 834 A1 | 9/1999 |
| EP | 0 098 587 A | 1/1984 |
| EP | 0 854 666 A | 7/1998 |
| GB | 1 587 998 A | 4/1981 |
| GB | 2 265 497 A | 9/1993 |

* cited by examiner

*Primary Examiner*—Boris Chervinsky
(74) *Attorney, Agent, or Firm*—Michael J. Striker

(57) ABSTRACT

A housing for an electrical device has a plurality of housing parts, including a first housing part adapted to carry an electronic component and having a mounting surface with a crease, and a second housing part arranged on the mounting surface and formed so that it at least sealingly engages in the crease of the first housing part, so as to enhance a heat withdrawal from the electronic components.

7 Claims, 1 Drawing Sheet

HOUSING FOR AN ELECTRICAL DEVICE

BACKGROUND OF THE INVENTION

The present invention relates to a housing for an electrical device, such as for example for an electronic control-or regulating device in a motor vehicle.

An electrical switching-or control device for a motor vehicle is disclosed for example in the German patent document DE-OS 43 43 355. In this device the waste heat is withdrawn from the power components to a cooling body through a support web. The power components are arranged for example on a conductive plate for an electronic circuit in a housing, which as a rule is a metallic housing.

The conventional housing concepts are usually realized with cast cooling bodies or with a housing construction provided with heat conductive pins. Their cost-favorable manufacture, for example in fully automatic manufacturing devices, is thereby problematic since the cooling bodies must frequently be adapted to various housing concepts when needed.

SUMMARY OF THE INVENTION

Accordingly, it is an object of present invention to provide a housing for an electrical device, which avoids the disadvantages of the prior art.

In accordance with the present invention a housing for an electrical device, in which several housing parts are assembled and a cooling body is used conventionally for a heat withdrawal from electronic components, and wherein in accordance with the present invention the first housing part which carries the electronic components is provided on a mounting surface with a crease. A second heat conductive housing part is joined on the mounting surface in correspondence with it and designed so that, a housing portion which corresponds to the crease engages it in a sealing and heat conductive manner.

The second housing part is a base plate, preferably of aluminum. A heat withdrawal for the power components can be performed to the second housing part.

The inventive housing in accordance with an especially advantageous embodiment can be formed as a mounting housing for a control-or regulating device, which is arranged as a mechanical aggregate, for example a metallic pump housing, in a motor vehicle.

In accordance with the invention, it is advantageous when the second housing part is also provided with a crease, whose bulge engages on the lower side into a crease of the first housing part, and whose groove on the upper part engages a third housing part with a correspondingly designed bulge. The third housing part can be for example a metallic cover. It is also possible to replace the second housing part completely by a cover, which provides an especially cost-favorable solution.

An especially efficient heat withdrawal and sealing action is obtained when the crease is arranged in a first and in a second housing part, circumferentially in the edge region of the housing part. In this case, in a simple manner in the region of the crease, the mounting point of the housing part on the aggregate can be arranged. It improves the possibilities for the heat withdrawal, for example to the aggregate. The mounting points are here more advantageous than four screws distributed over the periphery and guided in corresponding bushings through the housing parts to the aggregate.

The lower side of the crease of the second housing part on the connecting point between the first and the second housing part can be formed in a simple manner as an adhesive key, while the crease on the connecting point between the second and the third housing part can be formed as an adhesive slot. Thereby the manufacture and assembly are simplified.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
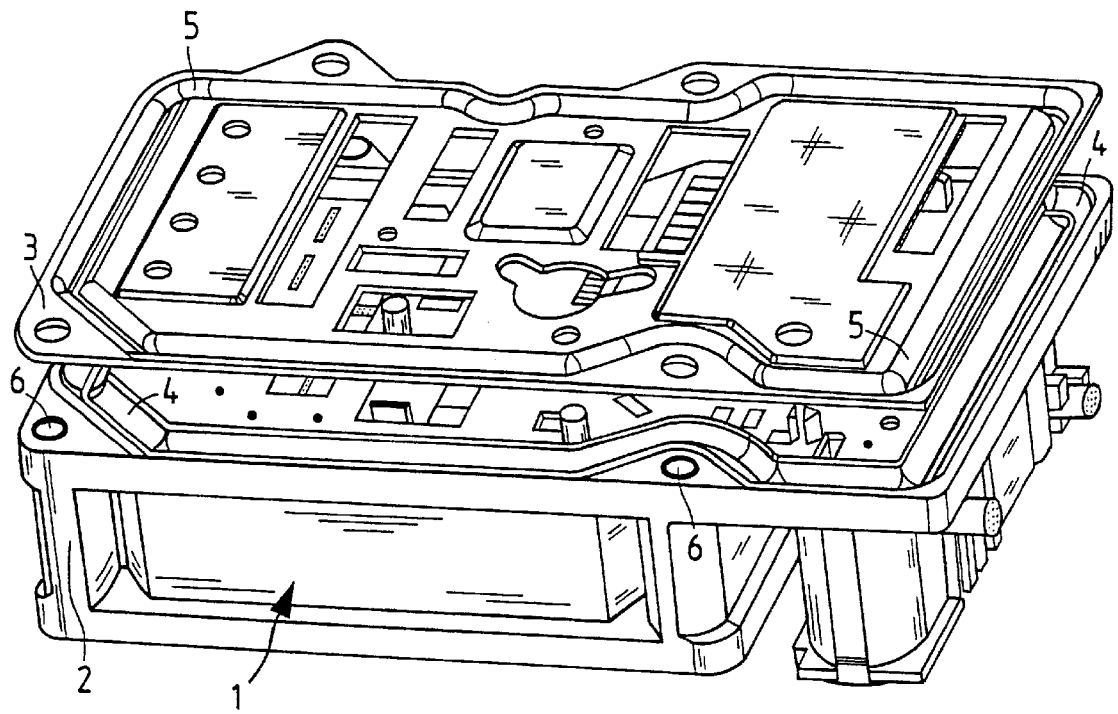
FIG. 1 is a perspective view of a mounting housing for a control-and/or regulating unit in a motor vehicle, with a first and a second housing part.

A housing 1 for a control-and regulating device in accordance with one embodiment is shown in FIG. 1. It has a first housing part 2 and a base plate 3 with cooling properties. The housing 1 is a mounting housing, which can be mounted on a pump housing in a motor vehicle.

The housing part 2 has an upper mounting surface which, in its edge region, is provided a with circular crease 4. The crease 4 has a substantially round contour, transversely to the direction of its extension. The base plate 3 is composed of heat-conductive material. It also has a circumferential crease 5 which has a contour at least corresponding to the lower bulging of the crease 4.

The housing part 2 and the base plate 3 sealingly abut against one another in the crease 4, at the connecting points between the first housing part 2 and the base plate 3. During assembly, a so-called adhesive key, an adhesive bonding layer, can be arranged in the crease 4.

Figure 2:
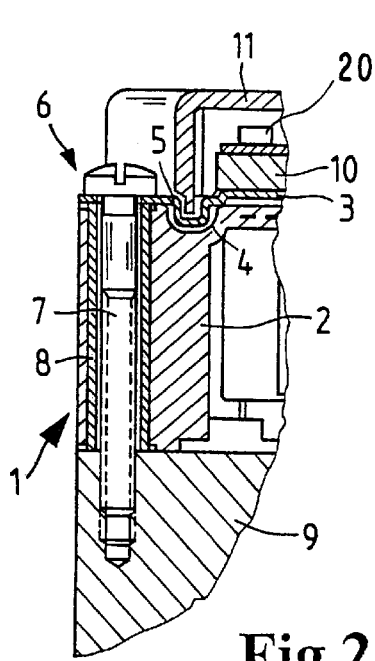
FIG. 2 is a view showing a section of a detail through a mounting point in accordance with one embodiment of the housing of FIG. 1.

FIG. 2 shows a detailed section of one of several mounting points 6. It is composed of a screw 7 which is guided through the base plate 3 in a bushing 8 of the first housing part 2 and is screwed on the pump housing 9. As can be clearly seen from FIG. 2, the base plate 3 comes to abutment with its crease 5 in the crease 4 of the first housing part 2.

A further, heat conductive plate 10 with a ceramic plate for a signal electronics or power components 20 is arranged on the base plate 3. Its heat can be withdrawn through the base plate 3. The creases 4 and 5 produce a connection between the heat conductive tight region (signal electronics) and the heat conductive untight region (screw 7). The base plate extends to the area under the head of the screw 7, so that the heat is withdrawn through the screw 7 and the bushing 8 in the aggregate.

As shown in FIG. 2, the housing 1 is closed with a clover 11. In the upper part of the crease 5 it comes to abutment against the base plate 3 and is mounted there by means of an adhesive slot, or an adhesive bonding agent fitted into the crease.

Figure 3:
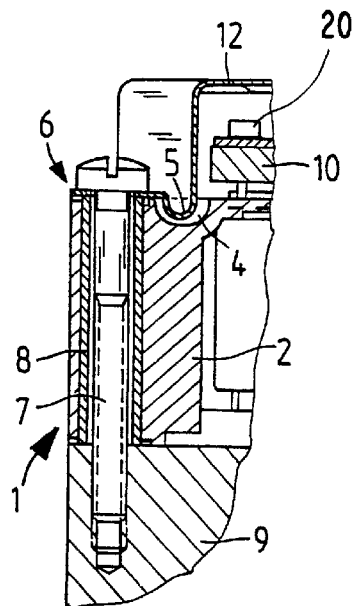
FIG. 3 is a section of a detail through a mounting point, in accordance with another embodiment, with a cover as a second housing part.

FIG. 3 shows another embodiment of the housing 1. In deviation from the above described embodiment, a cover 12 is directly arranged in the crease 4 of the first housing part 2. Thereby the base plate 3 is dispensed with. The cover 12 has an adhesive region which is shaped in correspondence with the crease 4. In FIG. 3, the crease 4 facilitates the adhesive connection between the cover 12 and the housing part 2. Here the cover 12 however must not be necessarily composed of a heat conductive material.

It will be understood that each of the elements described above, or two or more together, may also find a useful application in other types of constructions differing from the types described above.

While the invention has been illustrated and described as embodied in housing for an electrical device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims:

What is claimed is:

1. A housing for an electrical device, comprising first and second housing parts, wherein each of said first and second housing part has a crease running about an edge area, wherein the crease of the second housing part sealingly engages the crease of the first housing part, wherein said second housing part is heat conductive, said second housing part having a heat-conductive plate, wherein electronic components are disposed on said heat-conductive plate, said first and second housing parts being secured to an aggregate with screw means having screw heads, and wherein the second housing part projects under said screw heads, such that heat is conducted by means of said screw means to the aggregate.

2. A housing as defined in claim 1, wherein the first and second housing parts are connected to one another, and further comprising a third housing part, wherein said third housing part engages in the crease of the second housing part.

3. A housing as defined in claim 2, wherein said third housing part is a cover.

4. A housing as defined in claim 1, wherein the heat-conductive plate with electronic components is disposed on the first housing part, and wherein the second housing part is a cover.

5. A housing as defined in claim 1, wherein the first and second housing parts are adhered to one another by means of the creases in the first and second housing parts.

6. A housing as defined in claim 1, further comprising a third housing part, wherein said third housing part is adhered to the second housing part by means of the crease in said second housing part and a crease in said third housing part.

7. A housing as defined in claim 1, wherein said aggregate is a metallic pump housing in a motor vehicle.

* * * * *